(12) United States Patent
Lin

(10) Patent No.: US 9,214,945 B2
(45) Date of Patent: Dec. 15, 2015

(54) DIGITAL PHASE LOCK LOOP AND METHOD THEREOF

(75) Inventor: Chia-Liang Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 555 days.

(21) Appl. No.: 13/405,927

(22) Filed: Feb. 27, 2012

(65) Prior Publication Data

US 2013/0222023 A1   Aug. 29, 2013

(51) Int. Cl.
*H03L 7/06* (2006.01)
*H03L 7/087* (2006.01)
*H03L 7/099* (2006.01)
*H03L 7/10* (2006.01)

(52) U.S. Cl.
CPC ............. *H03L 7/087* (2013.01); *H03L 7/099* (2013.01); *H03L 7/101* (2013.01); *H03L 2207/50* (2013.01)

(58) Field of Classification Search
None
See application file for complete search history.

(56) References Cited

U.S. PATENT DOCUMENTS

| | | | |
|---|---|---|---|
| 5,789,954 A * | 8/1998 | Toeppen et al. | 327/158 |
| 6,404,363 B1 | 6/2002 | Park et al. | |
| 6,639,939 B1 * | 10/2003 | Naden et al. | 375/140 |
| 6,831,940 B2 * | 12/2004 | Harms et al. | 375/130 |
| 6,920,622 B1 * | 7/2005 | Garlepp et al. | 327/147 |
| 6,970,046 B2 | 11/2005 | Da Dalt et al. | |
| 7,242,224 B1 * | 7/2007 | Li et al. | 327/105 |
| 7,312,642 B1 * | 12/2007 | Li et al. | 327/105 |
| 7,398,163 B2 * | 7/2008 | Tsukamoto et al. | 702/32 |
| 7,508,896 B2 * | 3/2009 | Johnson et al. | 375/376 |
| 7,899,633 B2 * | 3/2011 | Tsukamoto et al. | 702/75 |
| 8,050,647 B2 * | 11/2011 | Ibrahim et al. | 455/313 |
| 2007/0040718 A1 * | 2/2007 | Lee | 341/143 |

FOREIGN PATENT DOCUMENTS

| | | |
|---|---|---|
| CN | 1275835 A | 12/2000 |
| CN | 1398455 A | 2/2003 |

OTHER PUBLICATIONS

Chinese language article at: http://baike.baidu.com/history/26979590, Jan. 29, 2012.
China Office Action dated Apr. 1, 2015.

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

An apparatus of digital phase lock loop and method are provided. In one embodiment, an apparatus comprises: an analog-to-digital converter (ADC) for converting a voltage level of an output clock into a first digital word in accordance with a timing defined by a reference clock; a first digital loop filter for receiving the first digital word and outputting a control code; a circuit to receive the reference clock and the output clock and output an offset code according to a frequency error of the output clock with respect to a frequency of the reference clock; an adder for generating an offset control code by summing the control code with the offset code; and a digitally controlled oscillator for outputting the output clock in accordance with the offset control code.

11 Claims, 2 Drawing Sheets

DIGITAL PHASE LOCK LOOP AND METHOD THEREOF

FIELD OF TECHNOLOGY

This disclosure generally relates to digital phase lock loops and more particularly to digital phase lock loops generating an output clock based on control and offset codes.

BACKGROUND

As depicted in FIG. 1, a digital phase lock loop (DPLL) 100 comprises: a TDC (time-to-digital converter) 110 for receiving a reference clock and a feedback clock and outputting a timing error signal representing a difference in timing between the reference clock and the feedback clock; a digital loop filter 120 for receiving the timing error signal and outputting a control code by filtering the timing error signal; a DCO (digitally controlled oscillator) 130 for receiving the control code and outputting an output clock of an oscillation frequency controlled by the control code; and a divide-by-N circuit 140 for receiving the output clock and outputting the feedback clock by dividing down the output clock by a factor of N, where N is an integer. When the reference clock is faster than the feedback clock: the timing error signal is positive, causing the control code to increase, resulting in an increased frequency of the output clock, and accordingly the feedback clock. When the reference clock is slower than the feedback clock: the timing error signal is negative, causing the control code to decrease, resulting in a decrease of the output clock, and accordingly the feedback clock. Therefore, a timing of the output clock is controlled in a closed-loop manner so as to make a timing of the feedback clock track a timing of the reference clock.

TDC 110 is an important functional block in digital phase lock loop 100. For the feedback clock to be able to precisely track the reference clock, TDC 110 must have a high precision. TDC 110 quantizes the timing difference between the reference clock and the feedback clock into a digital word representing the timing error signal; the precision is determined by the weight of the LSB (least significant bit) of the digital word. Prior art TDC is usually constructed from a cascade of a plurality of unit delay cells, and the weight of the LSB is determined by a delay of the unit delay cell. In modern CMOS (complementary metal-oxide semiconductor) technologies, the delay of the unit delay cell is typically around 10 ps. Therefore, the precision of timing detection is limited to 10 ps. Although many efforts have been taken to seek to improve the precision of TDC, it is difficult to attain high precision without paying a high premium in circuit area and power consumption.

What is desired is a method of high precision timing detection for digital phase lock loop without using time-to-digital converter.

SUMMARY

In an embodiment, a digital phase lock loop comprises: an analog-to-digital converter (ADC) for converting a voltage level of an output clock into a first digital word in accordance with a timing defined by a reference clock; a first digital loop filter for receiving the first digital word and outputting a control code; a frequency detector for receiving the reference clock and the output clock and outputting a second digital word representing a frequency error of the output clock with respect to a frequency of the reference clock; a second digital loop filter for receiving the second digital word and outputting an offset code; an adder for generating an offset control code by summing the control code with the offset code; and a digitally controlled oscillator for outputting the output clock in accordance with the offset control code.

In a further embodiment: during an initial frequency acquisition, the offset code is adaptive while the control code is frozen until a frequency error of the output frequency is approximately zero, and then the offset code is frozen and the control code is adaptive.

In an embodiment, a method comprises: receiving a reference clock; sampling a voltage level of an output clock in accordance with a timing of the reference clock; generating a first digital word by performing analog-to-digital conversion on the voltage level; generating a control code by filtering the first digital word; generating a second digital word by detecting a frequency of the output clock using a reference frequency of the reference clock; generating an offset code by filtering the second digital word; generating an offset control code by summing the control code with the offset code; and generating the output clock using a digitally controlled oscillator controlled by the offset control code.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1:
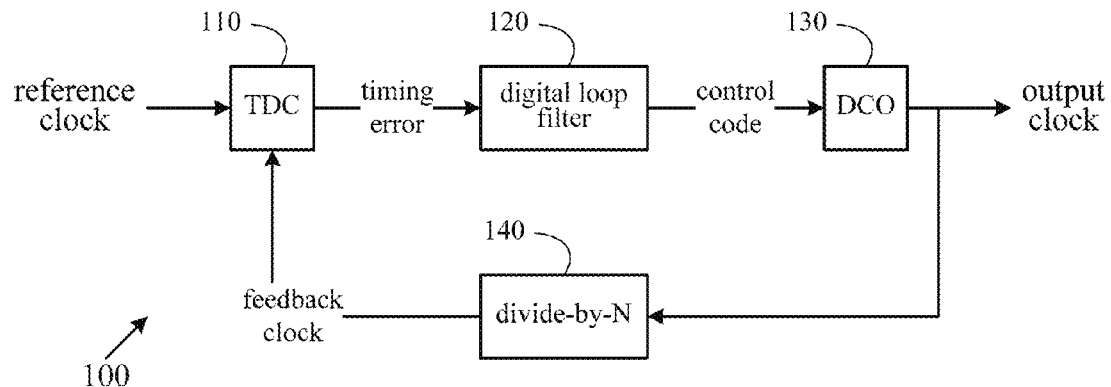
FIG. 1 shows a functional block diagram of a prior art digital phase lock loop.
Figure 2:
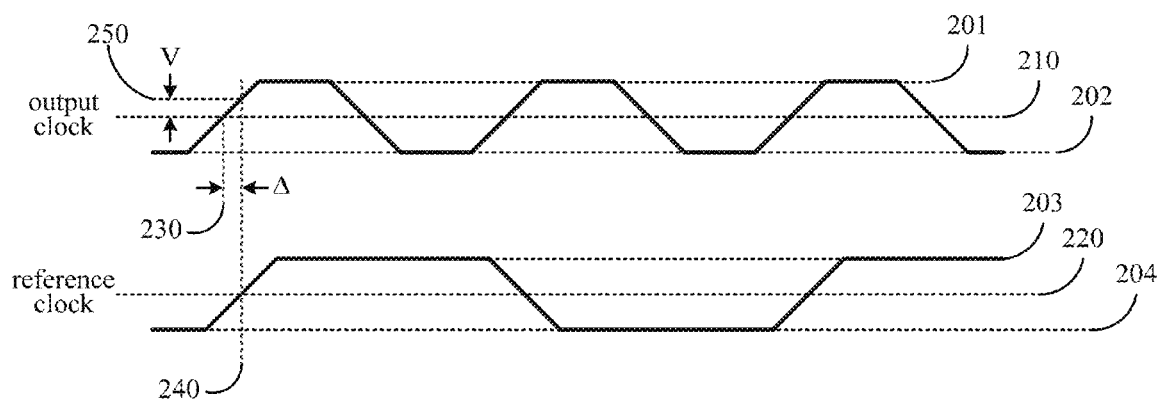
FIG. 2 shows an exemplary timing diagram of a digital phase lock loop.

Every clock signal has a finite rise/fall time. Due to the finite rise/fall time, a timing of the clock signal is related to a level of the clock signal. An exemplary timing diagram of a digital phase lock loop is shown in FIG. 2. The digital phase lock loop receives a reference clock and outputs an output clock to track a timing of the reference clock. The output clock and the reference clock cyclically toggle between a respective first level (202, 204) and a respective second level (201, 203). Due to the finite rise/fall time, neither the output clock nor the reference clock can instantly toggle from the respective first level to the respective second level. A timing of a clock of a finite rise time is defined by the timing instant where it rises and reaches a trip point. The output clock rises and reaches the trip point 210 at timing instant 230.

On the other hand, the reference clock rises and reaches the trip point 220 at timing instant 240. A timing difference between the output clock and the reference clock is defined by the difference, labeled as A in FIG. 2, between timing instant 230 and timing instant 240. If one uses the reference clock to sample the output clock, the voltage sampled (labeled as V in FIG. 2) at time instant 240 where the sampling occurs will be proportional to the timing difference A. Therefore, one can detect the sampled voltage V and convert it into a digital word to effectively represent the timing difference A.

Figure 3A:
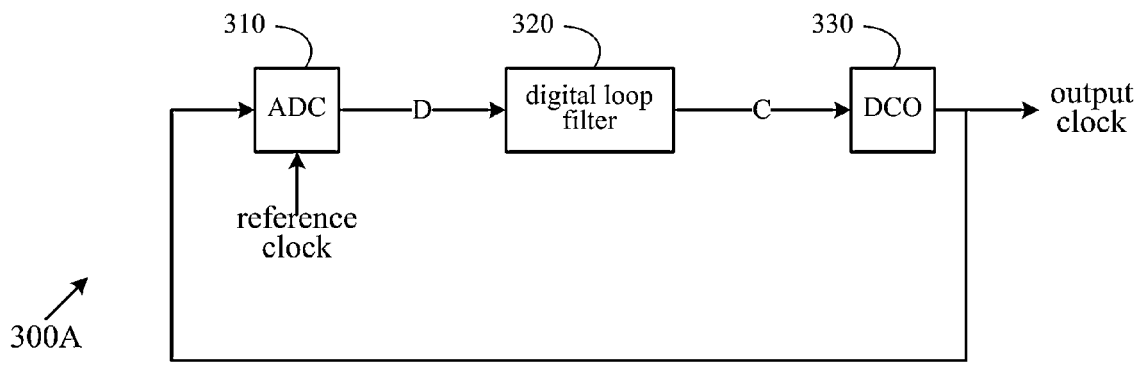
FIG. 3A shows a functional block diagram of a digital phase lock loop in accordance with an embodiment of the present invention.

In an embodiment shown in FIG. 3A, a digital phase lock loop (DPLL) 300A comprises: an ADC (analog-to-digital converter) 310 for receiving an output clock and converting a voltage level of the output clock into a digital word D in accordance with a timing of a reference clock; a digital loop filter 320 for receiving the digital word D and outputting a control code C; and a DCO (digitally controlled oscillator) 330 for receiving the control code C and outputting the output clock. DPLL 300A differs from prior art DPLL 100 in that: the divide-by-N circuit 140 is removed; and TDC 110 is replaced by ADC 310. Upon a rising edge of the reference clock (e.g., a timing instant where the reference clock rises and reaches a trip point), the voltage level of the output clock is sampled and converted into the digital word D, which as explained earlier effectively represents a timing difference between the reference clock and the output clock. In a typical example, the output clock is of 1V swing and 100 ps rise time; in this case, a timing difference of 1 ps corresponds to a voltage difference of 10 mV, which can be easily resolved by ADC. Unlike TDC where a timing difference around 1 ps is very difficult to resolve, ADC can easily resolve 10 mV voltage. Therefore, it is easier for DPLL 300A to achieve high performance than DPLL 100.

It is desired for ADC 310 to have a low latency, to minimize any it may introduce in the control loop and degrade the loop stability. Both flash ADC and SAR (successive approximation register) ADC have low latency (of no more than one reference clock cycle) and are suitable for embodying ADC 310. Flash ADC and SAR ADC are well known in prior art and thus there is no need to explain them in detail herein.

An embodiment of the digital loop filter 320 is reflected in the following z-transform representation:

$$C(z)=[K_p z^{-1}+K_i z^{-1}/(1-z^{-1})]D(z) \quad (1)$$

Here, $K_p$ and $K_i$ are two loop parameters to be determined by circuit designers.

Digitally controlled oscillator (DCO) is well known in prior art, thus there is no need to explain it in detail herein.

While DPLL 300A can be used to make the timing of the output clock precisely track the timing of the reference clock, the frequency of the output clock is not uniquely determined due to the sampling nature of the ADC 310, where a harmonic of the output clock cannot be distinguished from the output clock. For instance, if the reference clock is a 100 MHz clock, then the ADC 310 cannot distinguish a 1 GHz output clock from a 2 GHz output clock; it can only detect the voltage of the output clock at a present sampling instant (and therefore the timing difference between the output clock and the reference clock), but does not know how many times the output clock has toggled since last sampling. To make sure the output clock has a uniquely determined frequency, a further constraint is needed.

Figure 3B:
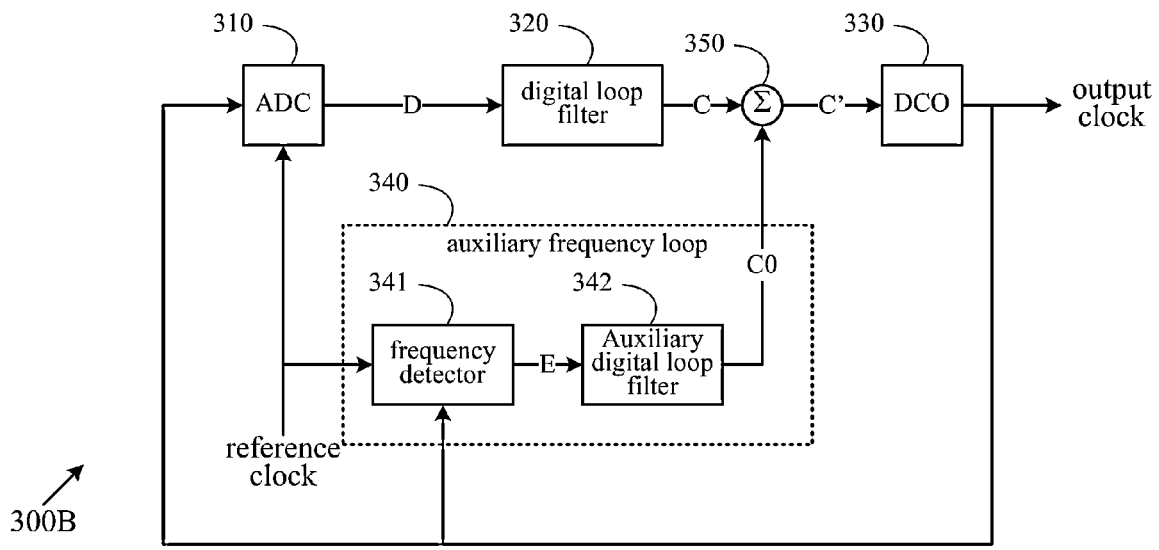
FIG. 3B shows a functional block diagram of a digital phase lock loop in accordance with a further embodiment of the present invention.

In a further embodiment 300B shown in FIG. 3B, an auxiliary frequency loop 340 is used to generate an offset code C0 to be added to the control code C (generated from the digital loop filter 320) by an adder 350, resulting in an offset control code C' for controlling DCO 330. Auxiliary frequency loop 340 is used to set the frequency of the output clock from DCO 330. Auxiliary frequency loop 340 comprises a frequency detector 341 for receiving the reference clock and the output clock and outputting a digital word E representing a frequency error of the output clock, and an auxiliary digital loop filter 342 for receiving the digital word E and outputting the offset code C0. In an embodiment, frequency detector 341 is a frequency counter for using the output clock to sample and count the reference clock. Upon a rising edge of the output clock, the counter value increments, unless a low-to-high transition of the reference clock is detected; when the low-to-high transition of the reference clock is detected, the counter value is latched and the counter is reset and the counting starts over again; and the latched value represents a detection of a ratio between the output clock frequency and the reference clock frequency. For instance, if the reference clock frequency is 25 MHz and the desired output clock frequency is 2 GHz, then ideally the frequency counter must count to 2 GHz/25 MHz=80 between two adjacent low-to-high transitions of the reference clock. If the latched counter value differs from the ideal value 80, it indicates a frequency error of the output clock. The latched counter value is subtracted by the ideal value, resulting in the digital word E representing a difference between the frequency of the output clock and a target output frequency. In an embodiment, the auxiliary digital loop filter 342 is represented by the following z-transform representation:

$$C0(z)=[K'_p z^{-1}+K'_i z^{-1}/(1-z^{-1})]E(z) \quad (3)$$

Here, $K'_p$ and $K'_i$ are two loop parameters to be determined by circuit designers.

In an embodiment, the auxiliary frequency loop 340 is activated and the control code C from the digital loop filter 320 is disregarded (i.e., effectively forced to zero) during an initial frequency-acquisition phase, so as to let the auxiliary frequency loop 340 solely establish C0 to ensure the output clock frequency is approximately equal to a target frequency. After the output clock frequency is approximately equal to the target frequency, the auxiliary frequency loop 340 is de-activated, the value of C0 is frozen, and the control code C is adjusted in closed loop manner to make the timing of the output clock track the timing of the referenced clock.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    an analog-to-digital converter (ADC) configured to convert a voltage level of an output clock into a first digital word in accordance with a timing defined by a reference clock;
    a first digital loop filter configured to receive the first digital word and outputting a control code, wherein the first digital loop filter comprises a digital integrator;
    a circuit to receive the reference clock and the output clock and output an offset code according to a frequency error of the output clock with respect to a frequency of the reference clock;
    an adder for generating an offset control code by summing the control code with the offset code; and
    a digitally controlled oscillator for outputting the output clock in accordance with the offset control code.

2. The apparatus of claim 1, wherein the analog-to-digital converter has a latency of no more than one reference clock cycle.

3. The apparatus of claim 1, the circuit further comprising:
a frequency detector for receiving the reference clock and the output clock and outputting a second digital word representing the frequency error of the output clock with respect to a frequency of the reference clock; and
a second digital loop filter for receiving the second digital word and outputting the offset code.

4. The apparatus of claim 3, wherein the second digital loop filter comprises a digital integrator.

5. The apparatus of claim 3, wherein the frequency detector comprises a frequency counter.

6. The apparatus of claim 1, wherein in an initial frequency acquisition phase the control code is frozen but the offset code is adaptive until a frequency of the output clock is approximately equal to a target frequency, then the offset code is frozen but the control code is adaptive.

7. A method comprising:
receiving a reference clock;
sampling a voltage level of an output clock in accordance with a timing of the reference clock;
generating a first digital word by performing analog-to-digital conversion on the voltage level;
generating a control code by filtering the first digital word, wherein filtering the first digital word comprises a digital integration;
generating an offset code according to a frequency error of the output clock with respect to a frequency of the reference clock
generating an offset control code by summing the control code with the offset code, wherein the step of generating the offset code further comprising:
generating a second digital word by detecting the frequency of the output clock using a reference frequency of the reference clock; and
producing the offset code by filtering the second digital word; and
generating the output clock using a digitally controlled oscillator controlled by the offset control code.

8. The method of claim 7, wherein the analog-to-digital conversion is of a latency of no more than one reference clock cycle.

9. The method of claim 7, wherein filtering the second digital word comprises performing a digital integration.

10. The method of claim 7, wherein detecting the frequency of the output clock comprises using a frequency counter.

11. A method comprising:
receiving a reference clock;
sampling a voltage level of an output clock in accordance with a timing of the reference clock;
generating a first digital word by performing analog-to-digital conversion on the voltage level;
generating a control code by filtering the first digital word, wherein filtering the first digital word comprises a digital integration;
generating an offset code according to a frequency error of the output clock with respect to a frequency of the reference clock
generating an offset control code by summing the control code with the offset code; and
generating the output clock using a digitally controlled oscillator controlled by the offset control code,
wherein in an initial frequency acquisition phase the control code is frozen but the offset code is adaptive until a frequency of the output clock is approximately equal to a target frequency, then the offset code is frozen but the control code is adaptive.

* * * * *